United States Patent
Xin et al.

(10) Patent No.: US 12,431,363 B2
(45) Date of Patent: Sep. 30, 2025

(54) METHOD FOR FABRICATING CONTACT STRUCTURE AND CONTACT STRUCTURE

(71) Applicant: CHANGXIN MEMORY TECHNOLOGIES, INC., Hefei (CN)

(72) Inventors: Xin Xin, Hefei (CN); Jinghao Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 452 days.

(21) Appl. No.: 17/867,683

(22) Filed: Jul. 19, 2022

(65) Prior Publication Data

US 2023/0138089 A1     May 4, 2023

Related U.S. Application Data

(63) Continuation of application No. PCT/CN2022/098105, filed on Jun. 10, 2022.

(30) Foreign Application Priority Data

Nov. 2, 2021    (CN) .......................... 202111286549.8

(51) Int. Cl.
    *H10B 12/00*       (2023.01)
    *H01L 21/3205*    (2006.01)
              (Continued)

(52) U.S. Cl.
CPC .. *H01L 21/32139* (2013.01); *H01L 21/32055* (2013.01); *H01L 21/32155* (2013.01); *H10B 12/485* (2023.02)

(58) Field of Classification Search
CPC ........ H01L 21/32155; H01L 21/32055; H10B 12/485
See application file for complete search history.

(56) References Cited

U.S. PATENT DOCUMENTS 5,219,786 A * 6/1993 Noguchi ............... H01L 21/268
                                                                    219/121.81
5,851,882 A * 12/1998 Harshfield ............. H10B 20/00
                                                                       438/983

(Continued)

FOREIGN PATENT DOCUMENTS

CN        102290376 A   * 12/2011
CN        107768253 A     3/2018

(Continued)

*Primary Examiner* — Dale E Page
*Assistant Examiner* — Michael Anguiano
(74) *Attorney, Agent, or Firm* — Kilpatrick Townsend & Stockton LLP

(57) ABSTRACT

Embodiments provide a method for fabricating a contact structure and a contact structure. The method for fabricating a contact structure includes: providing a substrate, and sequentially arranging a first polysilicon layer and a first mask layer on a surface of the substrate; performing a first etching process on the first polysilicon layer and the first mask layer to form a stepped structure where a width of the first mask layer is smaller than a width of the first polysilicon layer; performing a second etching process on the substrate by using the first polysilicon layer as a mask to form a trench; depositing a second polysilicon layer in the trench, a top of the second polysilicon layer being not higher than a bottom of the first mask layer; and performing an annealing process to form the contact structure.

14 Claims, 11 Drawing Sheets

(51) Int. Cl.
*H01L 21/3213* (2006.01)
*H01L 21/3215* (2006.01)

(56) References Cited

U.S. PATENT DOCUMENTS

| | | | | |
|---|---|---|---|---|
| 6,136,633 | A * | 10/2000 | Yaung | H01L 29/7833 |
| | | | | 257/E27.098 |
| 6,653,203 | B1 | 11/2003 | Huang et al. | |
| 10,546,863 | B1 | 1/2020 | Kobayashi | |
| 2009/0079446 | A1* | 3/2009 | Chatterjee | G01R 31/2621 |
| | | | | 324/719 |
| 2011/0049567 | A1* | 3/2011 | Peng | H01L 21/30608 |
| | | | | 257/190 |
| 2012/0289007 | A1* | 11/2012 | Liu | H10D 86/0225 |
| | | | | 438/158 |
| 2014/0154882 | A1 | 6/2014 | Kim et al. | |
| 2015/0179651 | A1 | 6/2015 | Park et al. | |

FOREIGN PATENT DOCUMENTS

| | | |
|---|---|---|
| CN | 111640746 A | 9/2020 |
| KR | 20150074629 A | 7/2015 |

\* cited by examiner

METHOD FOR FABRICATING CONTACT STRUCTURE AND CONTACT STRUCTURE

CROSS-REFERENCE TO RELATED APPLICATION

This application is a continuation of PCT/CN2022/098105, filed on Jun. 10, 2022, which claims priority to Chinese Patent Application No. 202111286549.8 titled "METHOD FOR FABRICATING CONTACT STRUCTURE AND CONTACT STRUCTURE" and filed on Nov. 2, 2021, the entire contents of which are incorporated herein by reference.

TECHNICAL FIELD

The present disclosure relates to the field of semiconductors, and more particularly, to a method for fabricating a contact structure and a contact structure.

BACKGROUND

In the existing technologies, in the process of manufacturing integrated circuits and electronic components, a method for improving defects in process steps of the integrated circuits is an important topic. In semiconductor processes, especially in the production of dynamic random access memory, occurrence of voids and holes in a polysilicon layer has become an important problem having a negative effect on performance and service life of semiconductor devices.

SUMMARY

The present disclosure provides a method for fabricating a contact structure, including: providing a substrate, and sequentially arranging a first polysilicon layer and a first mask layer on a surface of the substrate; performing a first etching process on the first polysilicon layer and the first mask layer to form a stepped structure where a width of the first mask layer is smaller than a width of the first polysilicon layer; performing a second etching process on the substrate by using the first polysilicon layer as a mask to form a trench; depositing a second polysilicon layer in the trench, a top of the second polysilicon layer being not higher than a bottom of the first mask layer; and performing an annealing process to form the contact structure.

The present disclosure also provides a contact structure fabricated by the above method.

DETAILED DESCRIPTION

Embodiments of a method for fabricating a contact structure and a contact structure provided by the present disclosure will be described in detail below with reference to the accompanying drawings.

Figure 1:
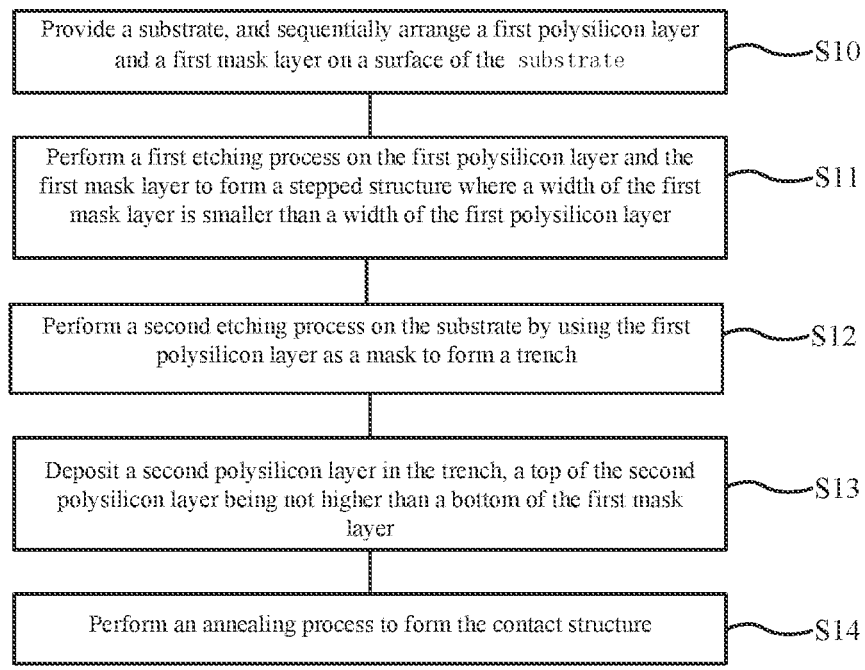
FIG. 1 is a schematic diagram showing steps of a method for fabricating a contact structure according to an embodiment of the present disclosure.

FIG. 1 is a schematic diagram showing steps of a method for fabricating a contact structure according to an embodiment of the present disclosure. The method includes: Step S10, providing a substrate, and sequentially arranging a first polysilicon layer and a first mask layer on a surface of the substrate; Step S11, performing a first etching process on the first polysilicon layer and the first mask layer to form a stepped structure where a width of the first mask layer is smaller than a width of the first polysilicon layer; Step S12, performing a second etching process on the substrate by using the first polysilicon layer as a mask to form a trench; Step S13, depositing a second polysilicon layer in the trench, a top of the second polysilicon layer being not higher than a bottom of the first mask layer; and Step S14, performing an annealing process to form the contact structure.

FIGS. 2A-2D are schematic process diagrams of Steps S10-S13 in FIG. 1 according to an embodiment of the present disclosure.

Figure 2A:
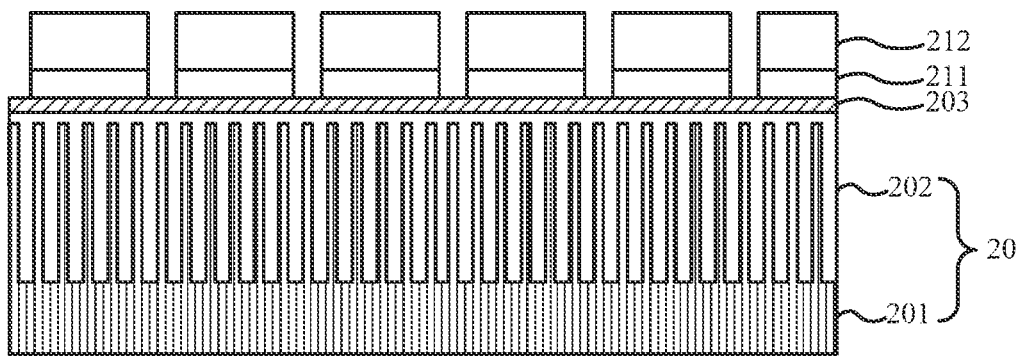
FIGS. 2A-2D are schematic process diagrams of Steps S10-S13 in FIG. 1 according to an embodiment of the present disclosure.

As shown in FIG. 2A, referring to Step S10, a substrate 20 is provided, and a first polysilicon layer 211 and a first mask layer 212 are sequentially arranged on the surface of the substrate 20. In an embodiment of the present disclosure, the substrate 20 includes a shallow trench isolation structure 202, which includes one or more of silicon oxide, silicon nitride, and silicon oxynitride. That is, a material used for the shallow trench isolation structure 202 includes one or more of silicon oxide, silicon nitride, and silicon oxynitride. In this embodiment, the shallow trench isolation structure 202 is made from silicon oxide, and the substrate 20 further includes a silicon substrate 201. In an embodiment of the present disclosure, the surface of the substrate 20 includes an insulating layer 203, which is positioned below the first polysilicon layer 211. The insulating layer 203 is made from SiN.

Figure 5:
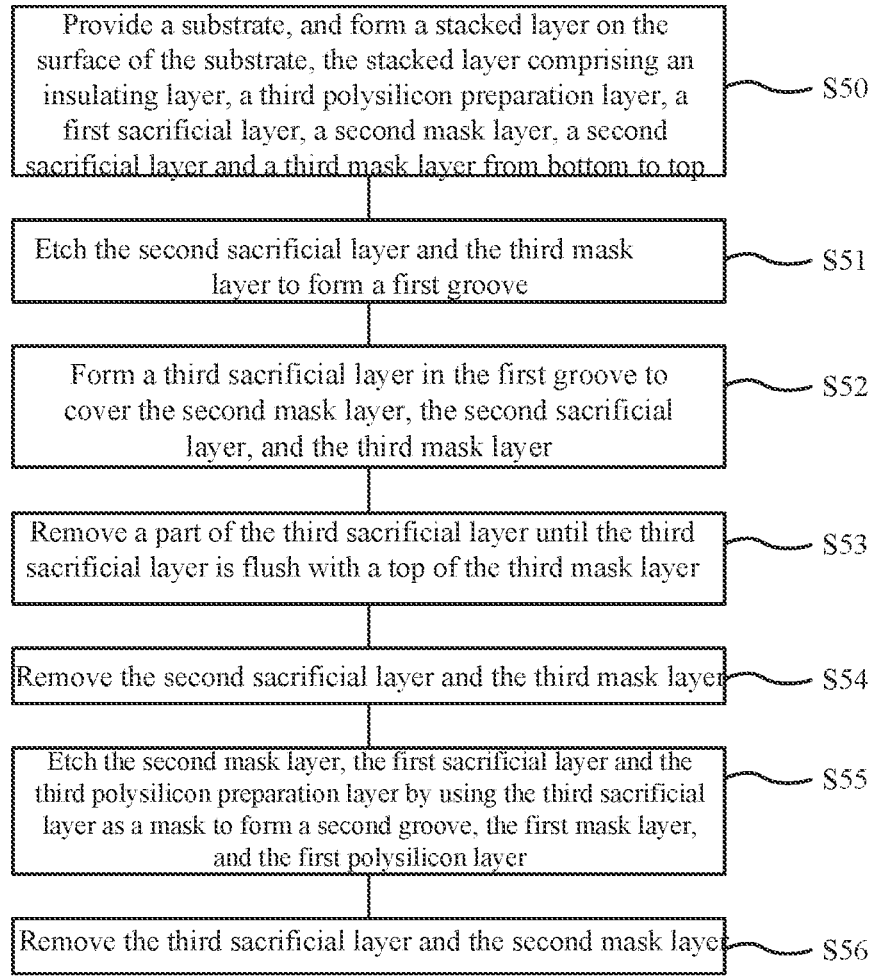
FIG. 5 is a schematic diagram showing steps before sequentially arranging a first polysilicon layer and a first mask layer on a surface of the substrate in the method for fabricating a contact structure according to an embodiment of the present disclosure.

FIG. 5 is a schematic diagram showing steps before sequentially arranging the first polysilicon layer 211 and the first mask layer 212 on the surface of the substrate 20 in the method for fabricating a contact structure according to an embodiment of the present disclosure. These steps include: Step S50, providing a substrate, forming a stacked layer on the surface of the substrate, the stacked layer comprising an insulating layer, a third polysilicon preparation layer, a first sacrificial layer, a second mask layer, a second sacrificial layer and a third mask layer from bottom to top; Step S51, etching the second sacrificial layer and the third mask layer to form a first groove; Step S52, forming a third sacrificial layer in the first groove to cover the second mask layer, the second sacrificial layer, and the third mask layer; Step S53, removing a part of the third sacrificial layer until the third sacrificial layer is flush with a top of the third mask layer; Step S54, removing the second sacrificial layer and the third mask layer; Step S55, etching the second mask layer, the first sacrificial layer and the third polysilicon preparation layer by using the third sacrificial layer as a mask to form a second groove, the first mask layer, and the first polysilicon layer; and Step S56, removing the third sacrificial layer and the second mask layer.

FIGS. 6A-6G are schematic process diagrams of Steps S50-S56 in FIG. 5 according to an embodiment of the present disclosure.

Figure 6A:
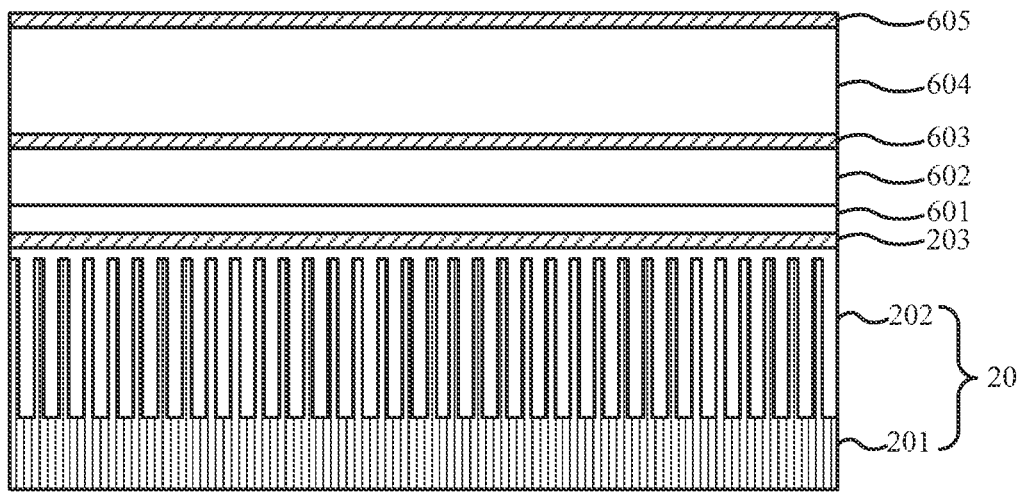
FIGS. 6A-6G are schematic process diagrams of Steps S50-S56 in FIG. 5 according to an embodiment of the present disclosure.

As shown in FIG. 6A, referring to Step S50, a substrate 20 is provided, and a stacked layer is formed on the surface of the substrate 20, where the stacked layer includes an insulating layer 203, a third polysilicon preparation layer 601, a first sacrificial layer 602, a second mask layer 603, a second sacrificial layer 604, and a third mask layer 605 from bottom to top. In an embodiment of the present disclosure, materials used for the first sacrificial layer 602 and the second sacrificial layer 604 include SOH and/or SOC. Materials of the second mask layer 603 and the third mask layer 605 include one or more of SiN, SiON, and SiCN. In an embodiment of the present disclosure, the substrate 20 includes a shallow trench isolation structure, and materials used for the shallow trench isolation structure 202 include one or more of silicon oxide, silicon nitride, and silicon oxynitride. In this embodiment, the shallow trench isolation structure 202 is made from silicon oxide, and the substrate 20 further includes a silicon substrate 201. In an embodiment of the present disclosure, the surface of the substrate 20 includes an insulating layer 203, and the insulating layer 203 is positioned below the third polysilicon preparation layer 601. The insulating layer 203 is made from SiN, and the third polysilicon preparation layer 601 is made from polysilicon.

Figure 6B:
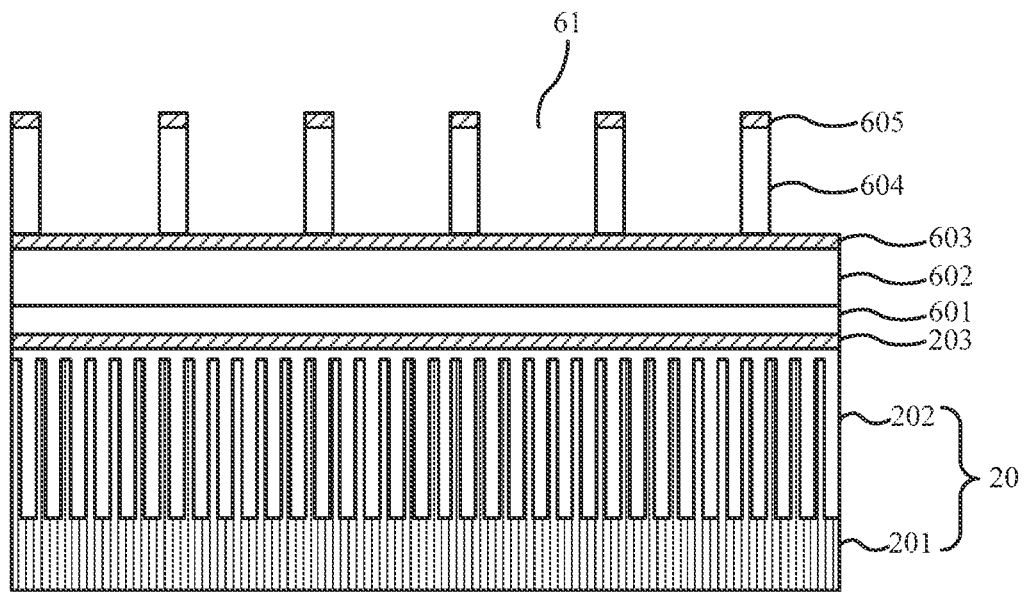

As shown in FIG. 6B, referring to Step S51, the second sacrificial layer 604 and the third mask layer 605 are etched to form a first groove 61. Precise positioning and etching are keys to the technology in this step, and the second sacrificial layer 604 and the third mask layer 605 will also be removed in subsequent steps.

Figure 6C:
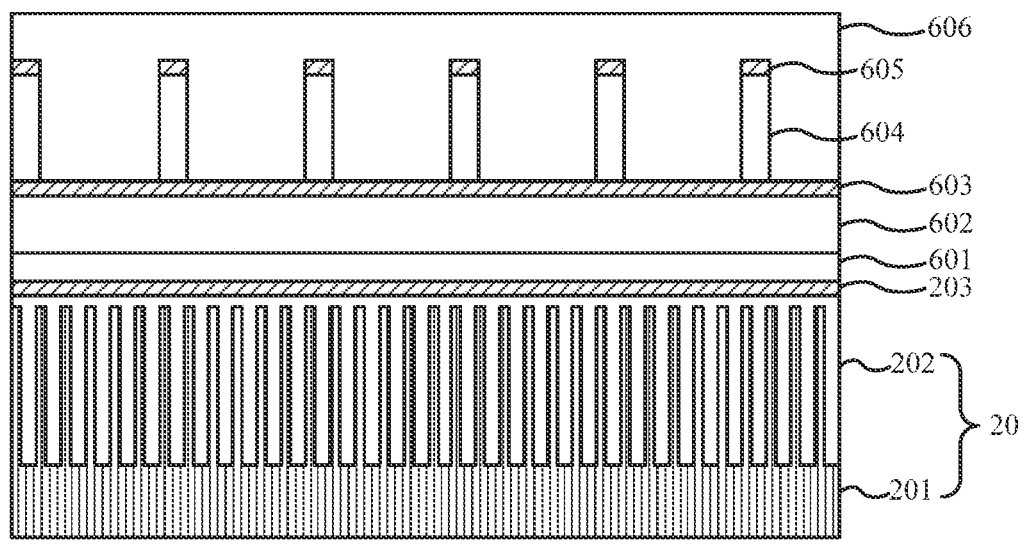

As shown in FIG. 6C, referring to Step S52, a third sacrificial layer 606 is formed in the first groove 61 to cover the second mask layer 603, the second sacrificial layer 604, and the third mask layer 605. In an embodiment of the present disclosure, the third sacrificial layer 606 is made from oxide, including but not limited to silicon oxide.

Figure 6D:
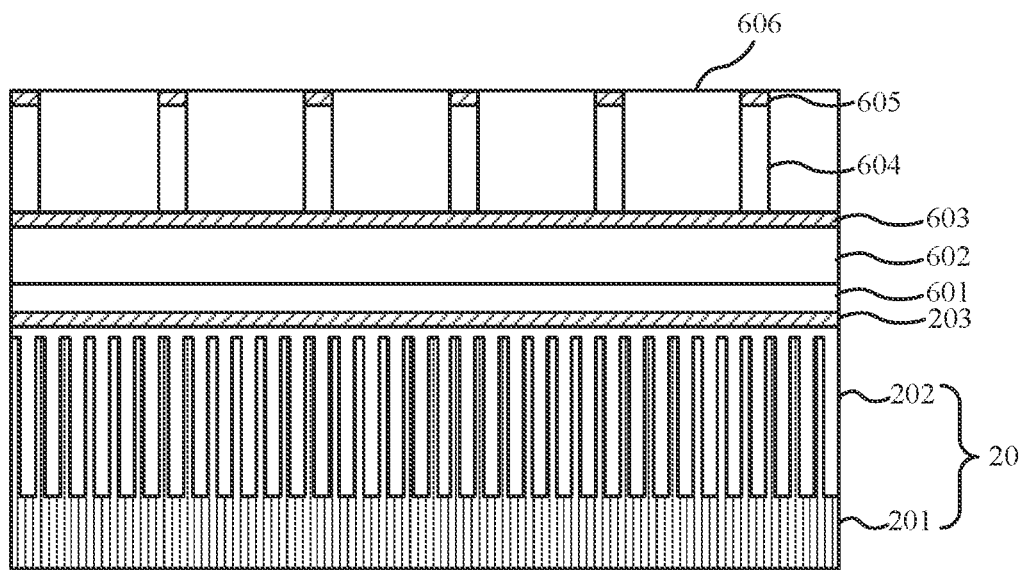

As shown in FIG. 6D, referring to Step S53, a part of the third sacrificial layer 606 is removed until the third sacrificial layer 606 is flush with the top of the third mask layer 605. The third mask layer 605 is exposed such that the second sacrificial layer 604 and the third mask layer 605 can be removed in subsequent steps.

Figure 6E:
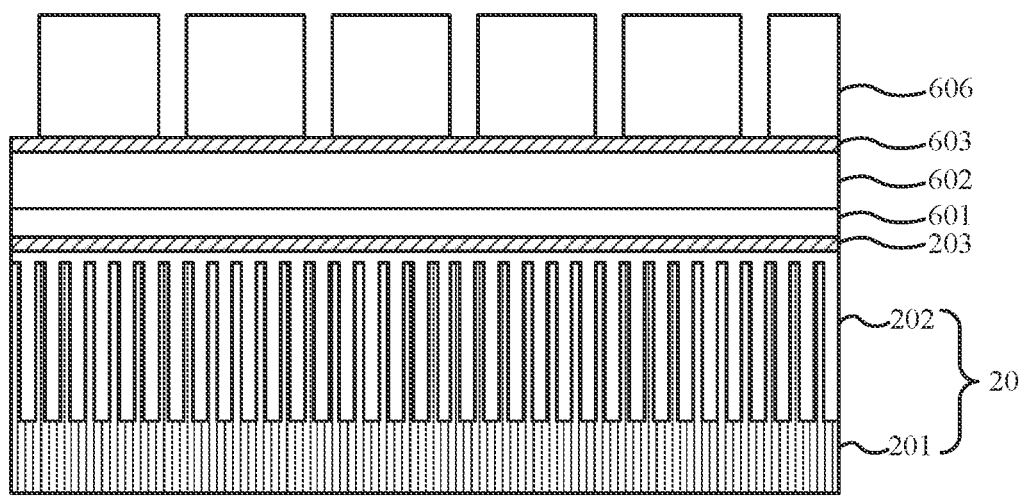

As shown in FIG. 6E, referring to Step S54, the second sacrificial layer 604 and the third mask layer 605 are removed. In an embodiment of the present disclosure, the removing the second sacrificial layer 604 and the third mask layer 605 adopts one or more of dry removal or wet removal.

Figure 6F:
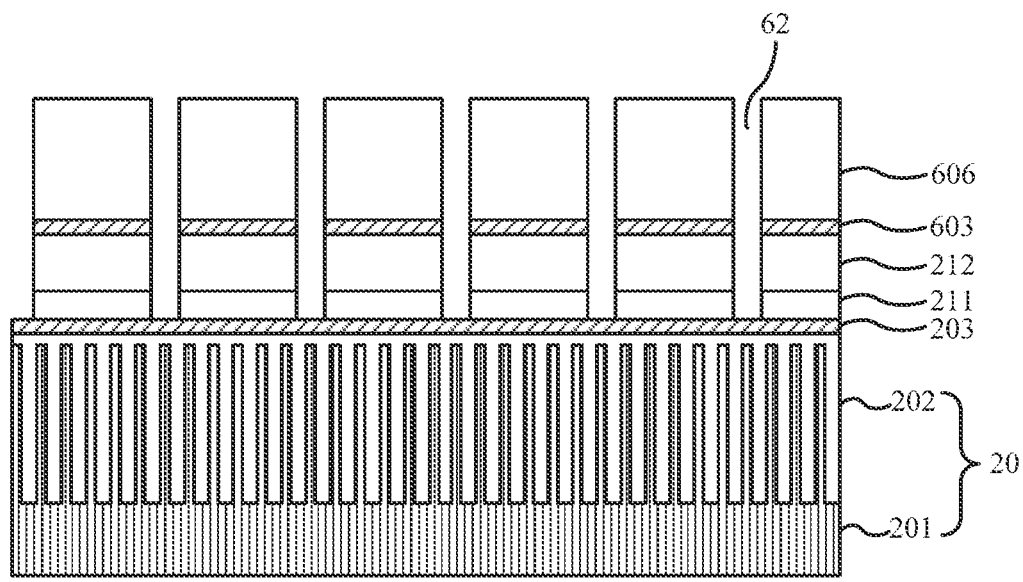

As shown in FIG. 6F, referring to Step S55, the second mask layer 603, the first sacrificial layer 602 and the third polysilicon preparation layer 601 are etched by using the third sacrificial layer 606 as a mask to form a second groove 62, the first mask layer 212, and the first polysilicon layer 211.

Figure 6G:
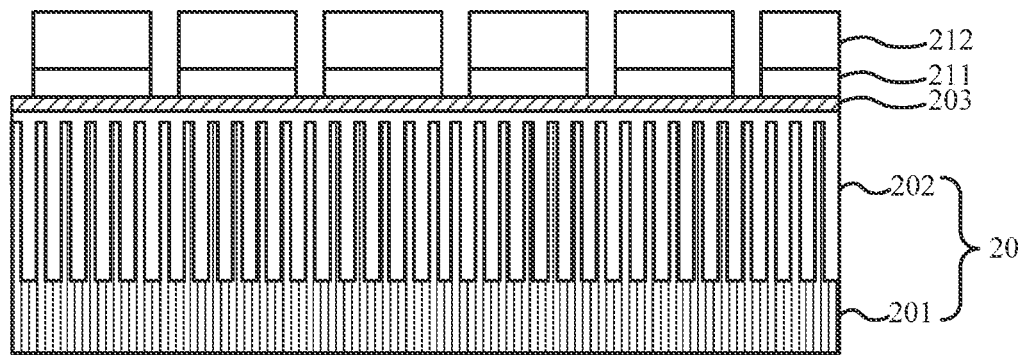

As shown in FIG. 6G, referring to Step S56, the third sacrificial layer 606 and the second mask layer 603 are removed. In this embodiment, the insulating layer 203, the first polysilicon layer 211 and the first mask layer 212 are retained on the substrate 20.

According to the above technical solution, by using the stepped structure in the process of fabricating the contact structure, a problem of formation of voids and holes in a bitline contact structure hole caused by a fact that a growth rate of a top of the bitline contact structure hole is greater than a growth rate of a middle of the bitline contact structure hole can be improved in a deposition process for fabrication of the bitline contact structure. Voids in the polysilicon layer of the contact structure are reduced, such that quality of the contact structure is improved, and the problem of defects in the contact structure is improved.

After the above steps are completed, the structure as shown in FIG. 2A is obtained, including: a substrate 20, where a first polysilicon layer 211 and a first mask layer 212 are sequentially arranged on the surface of the substrate 20. In an embodiment of the present disclosure, the substrate 20 includes a shallow trench isolation structure, and materials used for the shallow trench isolation structure 202 include one or more of silicon oxide, silicon nitride, and silicon oxynitride. In this embodiment, the shallow trench isolation structure 202 is made from silicon oxide, and the substrate 20 further includes a silicon substrate 201. In an embodiment of the present disclosure, the surface of the substrate 20 includes an insulating layer 203, which is positioned below the first polysilicon layer 211. The insulating layer 203 is made from SiN. On the basis of the structure as shown in FIG. 2A, the following steps are continued to be performed.

Figure 2B:
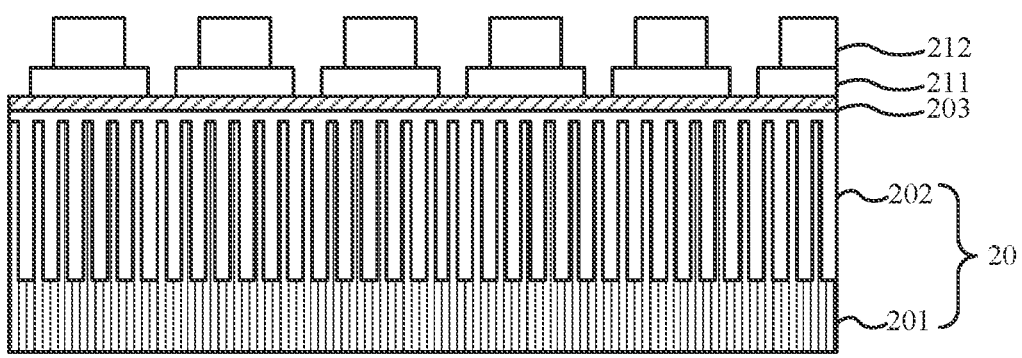

As shown in FIG. 2B, referring to Step S11, a first etching process is performed on the first polysilicon layer 211 and the first mask layer 212 to form a stepped structure where a width of the first mask layer 212 is smaller than a width of the first polysilicon layer 211. In an embodiment of the present disclosure, an etching rate of the first polysilicon layer 211 in the first etching process is lower than that of the first mask layer 212. Because the material used for the first mask layer 212 includes SOH and/or SOC and the material used for the first polysilicon layer 211 is polysilicon, a higher selectivity ratio is provided when a wet etching process is used, and it can be achieved that the etching rate of the first polysilicon layer 211 in the first etching process is lower than that of the first mask layer 212, such that a big-end-down stepped structure may be formed. In this embodiment, a ZIVIS machine is used in the first etching process to form the stepped structure where the width of the first mask layer 212 is smaller than the width of the first polysilicon layer 211, where the first etching process adopts a wet etching process, and an etching gas includes $H_2$ and/or $N_2$. The stepped structure formed by etching using the ZIVIS machine can leave a larger window on the top of the contact structure in the subsequent deposition process of the contact structure, to alleviate the problem of voids and holes.

Figure 2C:
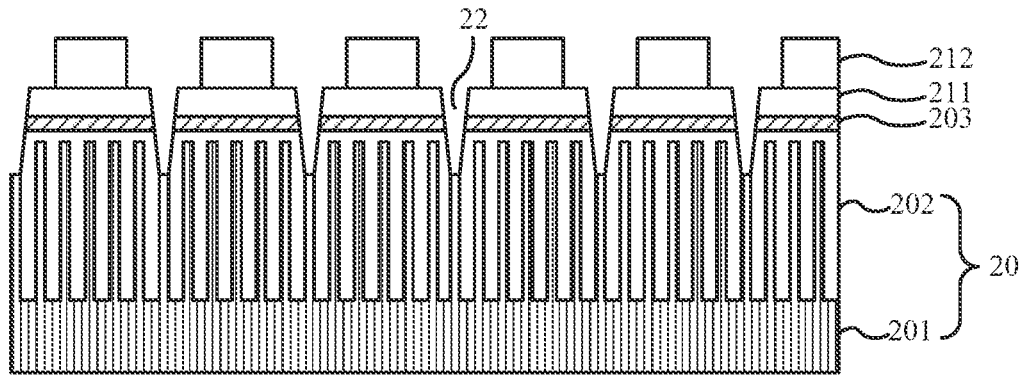

As shown in FIG. 2C, referring to Step S12, a second etching process is performed on the substrate 20 by using the first polysilicon layer 211 as a mask to form a trench 22. In an embodiment of the present disclosure, the second etching process includes: etching the insulating layer 203 and the substrate 20 to form the trench 22.

Figure 2D:
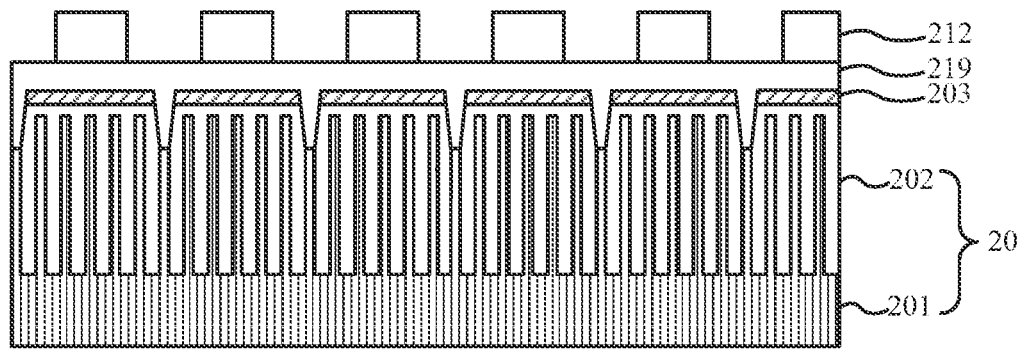

As shown in FIG. 2D, referring to Step S13, a second polysilicon layer 219 is deposited in the trench 22, where a top of the second polysilicon layer 219 is not higher than a bottom of the first mask layer 212. In this embodiment, the top of the second polysilicon layer 219 is flush with that of the original first polysilicon layer 211. In other embodiments of the present disclosure, the top of the second polysilicon layer 219 may also be lower than that of the original first polysilicon layer 211.

According to the above technical solution, by using the stepped structure in the process of fabricating the contact structure, a problem of formation of voids and holes in a bitline contact structure hole caused by a fact that a growth rate of a top of the bitline contact structure hole is greater than a growth rate of a middle of the bitline contact structure hole can be improved in a deposition process for fabrication of the bitline contact structure. Voids in the polysilicon layer of the contact structure are reduced, such that quality of the contact structure is improved, and the problem of defects in the contact structure is improved.

In other embodiments of the present disclosure, FIGS. 9A-9D are schematic process diagrams of Steps S10-S13 in FIG. 1.

Figure 9A:
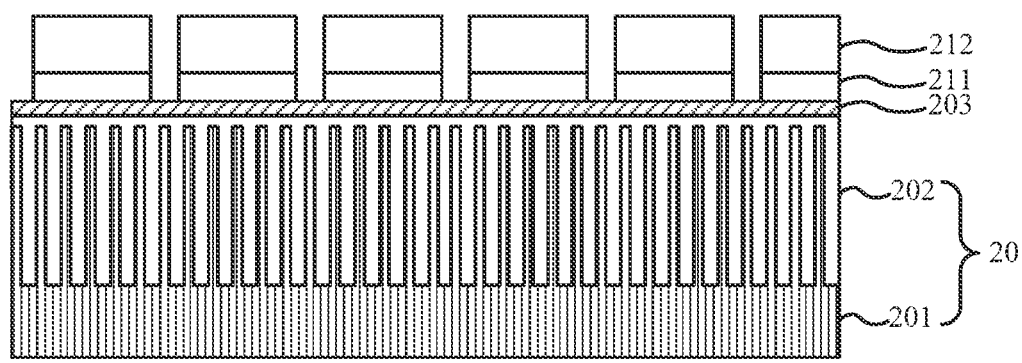
FIGS. 9A-9D are schematic process diagrams of Steps S10-S13 in FIG. 1 according to an embodiment of the present disclosure.

As shown in FIG. 9A, referring to Step S10, a substrate 20 is provided, and a first polysilicon layer 211 and a first mask layer 212 are sequentially arranged on the surface of the substrate 20. In an embodiment of the present disclosure, the substrate 20 includes a shallow trench isolation structure, and materials used for the shallow trench isolation structure 202 include one or more of silicon oxide, silicon nitride, and silicon oxynitride. In this embodiment, the shallow trench isolation structure 202 is made from silicon oxide, and the substrate 20 further includes a silicon substrate 201. In an embodiment of the present disclosure, the surface of the substrate 20 includes an insulating layer 203, which is positioned below the first polysilicon layer 211. The insulating layer 203 is made from SiN.

Figure 9B:
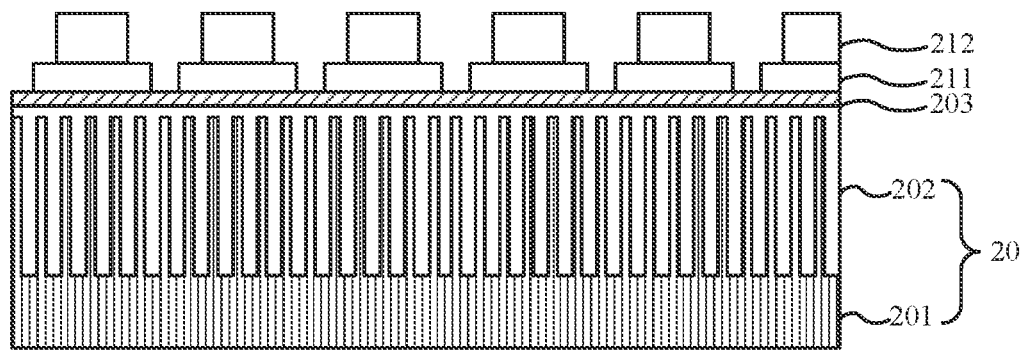

As shown in FIG. 9B, referring to Step S11, a first etching process is performed on the first polysilicon layer 211 and the first mask layer 212 to form a stepped structure where a width of the first mask layer 212 is smaller than a width of the first polysilicon layer 211. In an embodiment of the present disclosure, an etching rate of the first polysilicon layer 211 in the first etching process is lower than that of the first mask layer 212. Because the material used for the first mask layer 212 includes SOH and/or SOC and the material used for the first polysilicon layer 211 is polysilicon, a higher selectivity ratio is provided when a wet etching process is used, and it can be achieved that the etching rate of the first polysilicon layer 211 in the first etching process is lower than that of the first mask layer 212, such that a big-end-down stepped structure may be formed. In this embodiment, a ZIVIS machine is used in the first etching process to form the stepped structure where the width of the first mask layer 212 is smaller than the width of the first polysilicon layer 211, where the first etching process adopts a wet etching process, and an etching gas includes $H_2$ and/or $N_2$. The stepped structure formed by etching using the ZIVIS machine can leave a larger window on the top of the contact structure in the subsequent deposition process of the contact structure, to alleviate the problem of voids and holes.

Figure 9C:
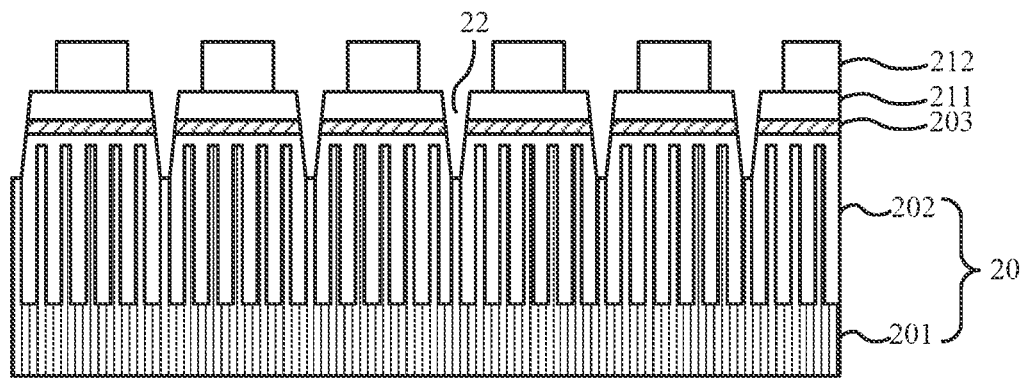

As shown in FIG. 9C, referring to Step S12, a second etching process is performed on the substrate 20 by using the first polysilicon layer 211 as a mask to form the trench 22. In an embodiment of the present disclosure, the second etching process includes: etching the insulating layer 203 and the substrate 20 to form the trench 22.

Figure 9D:
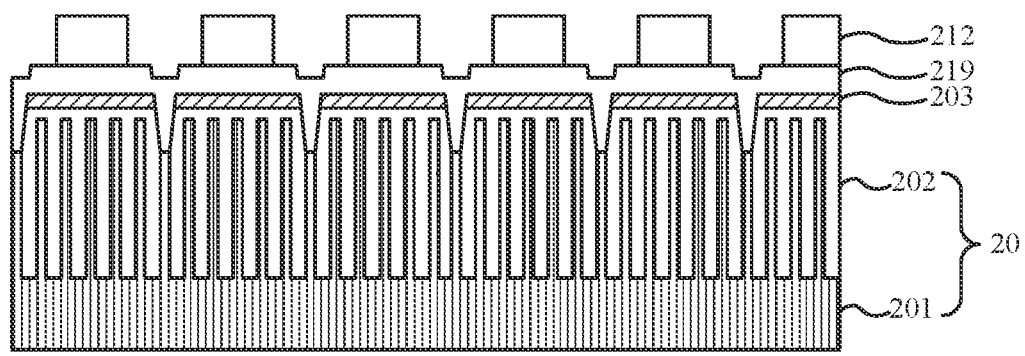

As shown in FIG. 9D, referring to Step S13, a second polysilicon layer 219 is deposited in the trench 22, where a top of the second polysilicon layer 219 is not higher than a bottom of the first mask layer 212. In this embodiment, the top of the second polysilicon layer 219 is lower than that of the original first polysilicon layer 211. This may expose possible holes and voids and facilitate removal of these holes and voids during subsequent annealing steps.

According to the above technical solution, by using the stepped structure in the process of fabricating the contact structure, a problem of formation of voids and holes in a bitline contact structure hole caused by a fact that a growth rate of a top of the bitline contact structure hole is greater than a growth rate of a middle of the bitline contact structure hole can be improved in a deposition process for fabrication of the bitline contact structure. Voids in the polysilicon layer of the contact structure are reduced, such that quality of the contact structure is improved, and the problem of defects in the contact structure is improved.

The step of forming the second polysilicon layer 219 in the above steps is further described as follows.

Figure 3:
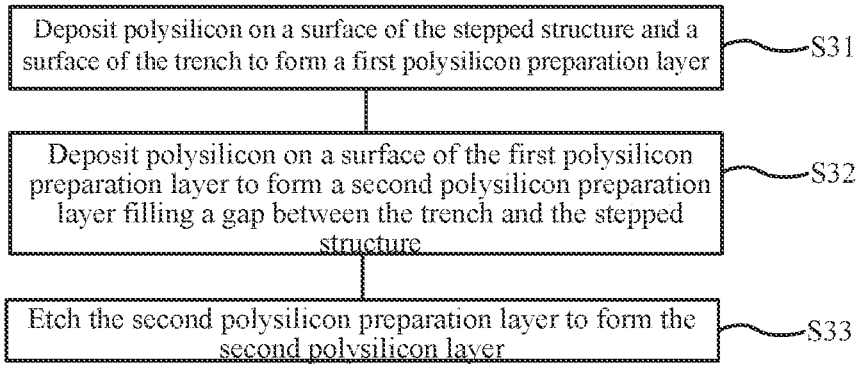
FIG. 3 is a schematic diagram showing a step of forming a second polysilicon layer in the method for fabricating a contact structure according to an embodiment of the present disclosure.

FIG. 3 is a schematic diagram showing a step of forming the second polysilicon layer 219 in the method for fabricating a contact structure according to an embodiment of the present disclosure. The step of forming the second polysilicon layer further includes: Step S31, depositing polysilicon on a surface of the stepped structure and a surface of the trench to form a first polysilicon preparation layer; Step S32, depositing polysilicon on a surface of the first polysilicon preparation layer to form a second polysilicon preparation layer filling a gap between the trench and the stepped structure; and Step S33, etching the second polysilicon preparation layer to form the second polysilicon layer.

Figure 4A:
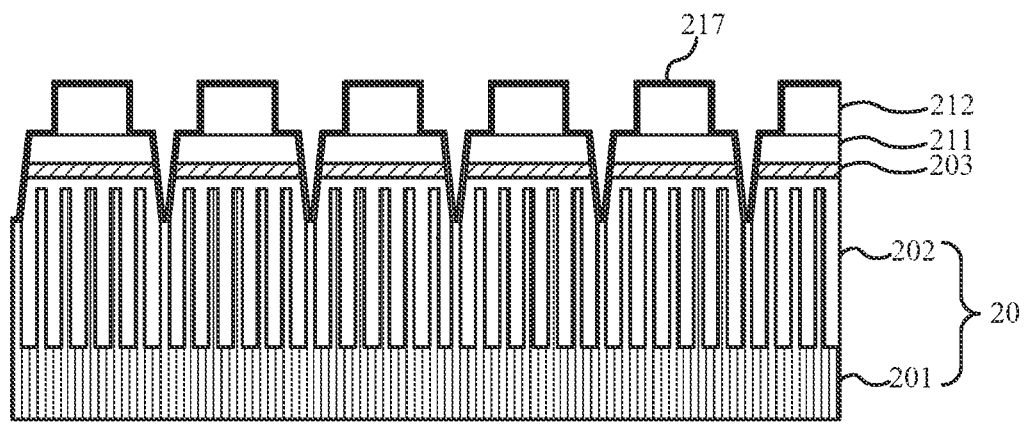
FIGS. 4A-4C are schematic process diagrams of Steps S31-S33 in FIG. 3 according to an embodiment of the present disclosure.
Figure 4B:
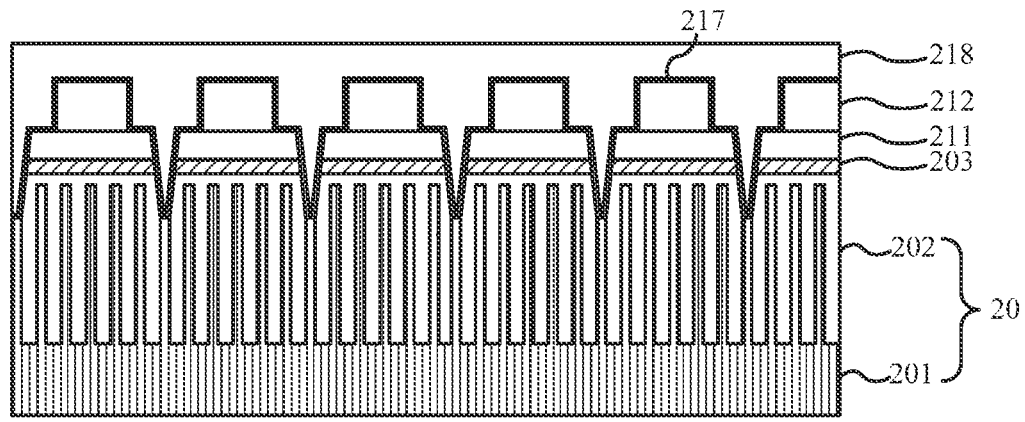
Figure 4C:
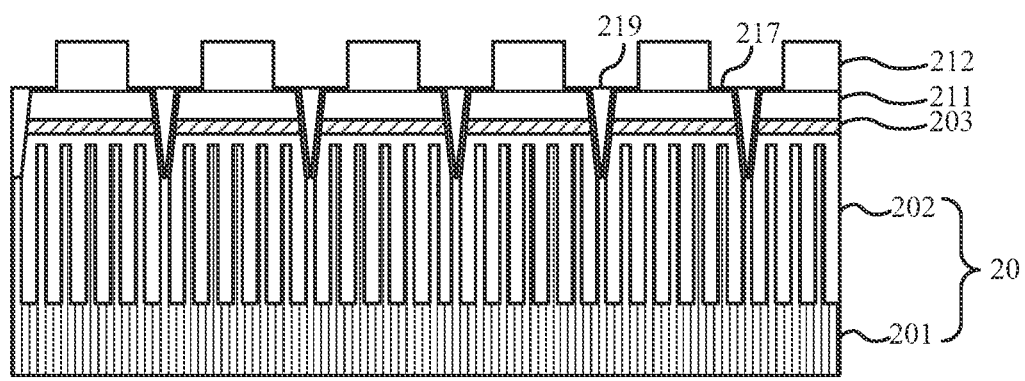

FIGS. 4A-4C are schematic process diagrams of Steps S31-S33 in FIG. 3 according to an embodiment of the present disclosure.

As shown in FIG. 4A, referring to Step S31, polysilicon is deposited on the surface of the stepped structure and the surface of the trench 22 to form a first polysilicon preparation layer 217. In an embodiment of the present disclosure, the first polysilicon preparation layer 217 and the second polysilicon layer 219 are made from different polysilicon materials.

As shown in FIG. 4B, referring to Step S32, polysilicon is deposited on a surface of the first polysilicon preparation layer 217 to form a second polysilicon preparation layer 218 filling a gap between the trench 22 and the stepped structure. In an embodiment of the present disclosure, the second polysilicon preparation layer 218 and the first polysilicon preparation layer 217 are made from different polysilicon materials.

As shown in FIG. 4C, referring to Step S33, the second polysilicon preparation layer 218 is etched to form a second polysilicon layer 219. A top of the second polysilicon layer 219 is not higher than a bottom of the first mask layer 212. In this embodiment, the top of the second polysilicon layer 219 is flush with that of the original first polysilicon layer 211. In other embodiments of the present disclosure, the top of the second polysilicon layer 219 may also be lower than that of the original first polysilicon layer 211.

Figure 7A:
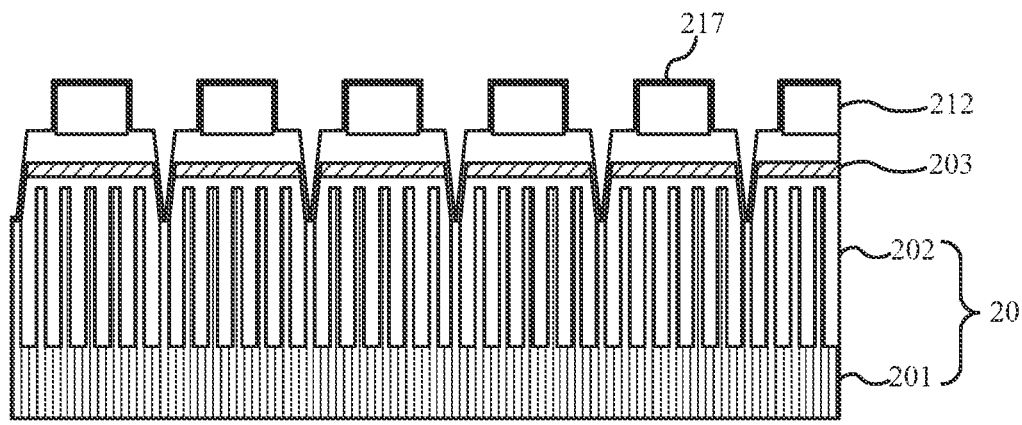
FIGS. 7A-7C are schematic process diagrams of Steps S31-S33 in FIG. 3 according to an embodiment of the present disclosure.
Figure 7B:
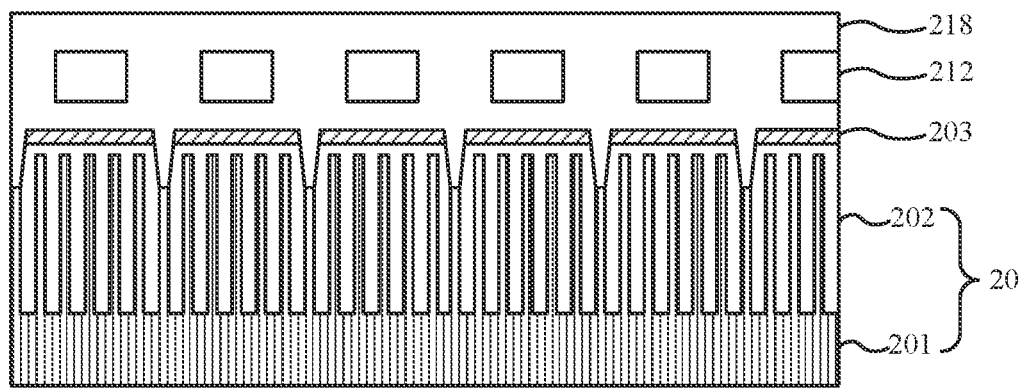
Figure 7C:
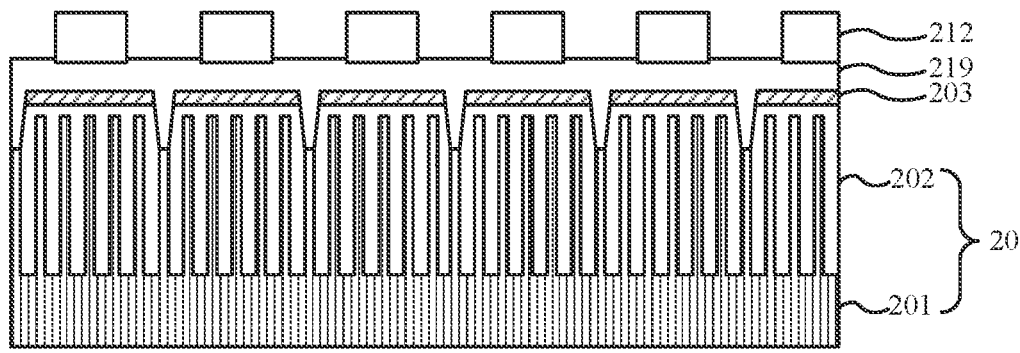

FIGS. 7A-7C are schematic process diagrams of Steps S31-S33 in FIG. 3 according to an embodiment of the present disclosure.

As shown in FIG. 7A, referring to Step S31, polysilicon is deposited on the surface of the stepped structure and the surface of the trench 22 to form the first polysilicon preparation layer 217. In an embodiment of the present disclosure, the first polysilicon preparation layer 217 and the second polysilicon layer 219 are made from the same polysilicon material. The deposited polysilicon and the second polysilicon layer 219 jointly form the first polysilicon preparation layer 217.

As shown in FIG. 7B, referring to Step S32, polysilicon is deposited on a surface of the first polysilicon preparation layer 217 to form a second polysilicon preparation layer 218 filling a gap between the trench 22 and the stepped structure. In an embodiment of the present disclosure, the second polysilicon preparation layer 218 and the first polysilicon preparation layer 217 are made from the same polysilicon material. The deposited polysilicon and the first polysilicon preparation layer 217 jointly form the second polysilicon preparation layer 218.

As shown in FIG. 7C, referring to Step S33, the second polysilicon preparation layer 218 is etched to form the second polysilicon layer 219. The top of the second polysilicon layer 219 is not higher than the bottom of the first mask layer 212. In this embodiment, the top of the second polysilicon layer 219 is flush with that of the original first polysilicon layer 211. In other embodiments of the present disclosure, the top of the second polysilicon layer 219 may also be lower than that of the original first polysilicon layer 211.

According to the above technical solution, by using the stepped structure in the process of fabricating the contact structure, a problem of formation of voids and holes in a bitline contact structure hole caused by a fact that a growth rate of a top of the bitline contact structure hole is greater than a growth rate of a middle of the bitline contact structure hole can be improved in a deposition process for fabrication of the bitline contact structure. Voids in the polysilicon layer of the contact structure are reduced, such that quality of the contact structure is improved, and the problem of defects in the contact structure is improved.

Figure 10A:
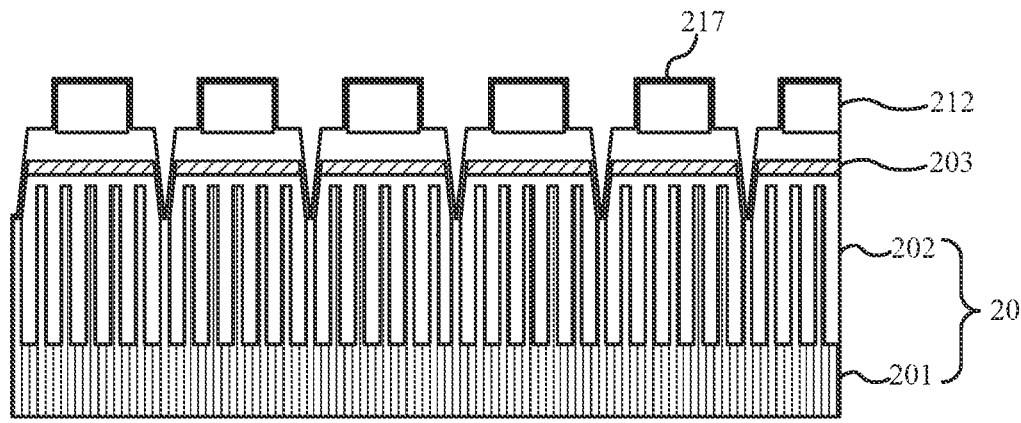
FIGS. 10A-10C are schematic process diagrams of Steps S31-S33 in FIG. 3 according to an embodiment of the present disclosure.
Figure 10B:
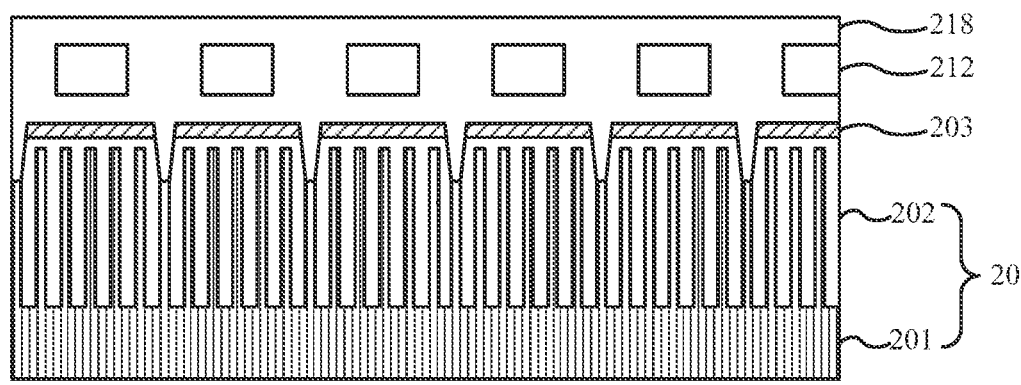
Figure 10C:
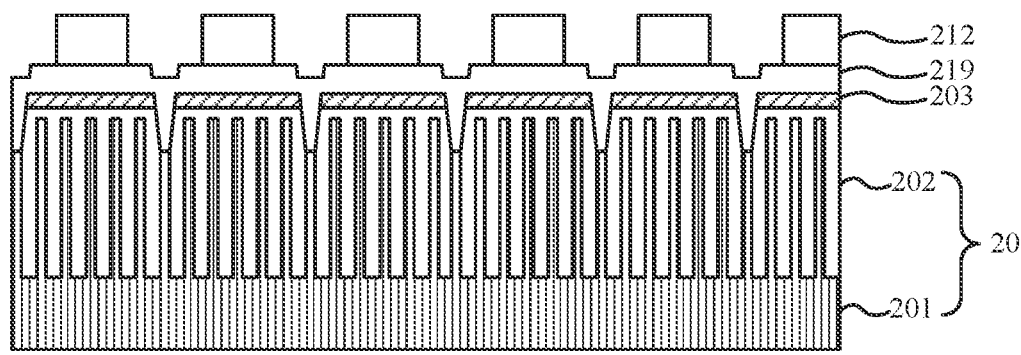

In other embodiments of the present disclosure, FIGS. 10A-10C are schematic process diagrams of Steps S31-S33 in FIG. 3.

As shown in FIG. 10A, referring to Step S31, polysilicon is deposited on the surface of the stepped structure and the surface of the trench 22 to form the first polysilicon preparation layer 217. In an embodiment of the present disclosure, the first polysilicon preparation layer 217 and the second polysilicon layer 219 are made from the same polysilicon material. The deposited polysilicon and the second polysilicon layer 219 jointly form the first polysilicon preparation layer 217.

As shown in FIG. 10B, referring to Step S32, polysilicon is deposited on a surface of the first polysilicon preparation layer 217 to form a second polysilicon preparation layer 218 filling a gap between the trench 22 and the stepped structure. In an embodiment of the present disclosure, the second polysilicon preparation layer 218 and the first polysilicon preparation layer 217 are made from the same polysilicon material. The deposited polysilicon and the first polysilicon preparation layer 217 jointly form the second polysilicon preparation layer 218.

As shown in FIG. 10C, referring to Step S33, the second polysilicon preparation layer 218 is etched to form the second polysilicon layer 219. The top of the second polysilicon layer 219 is not higher than the bottom of the first mask layer 212. In this embodiment, the top of the second polysilicon layer 219 is lower than that of the original first polysilicon layer 211.

According to the above technical solution, by using the stepped structure in the process of fabricating the contact structure, the problem of formation of voids and holes in a bitline contact structure hole caused by a fact that a growth rate of a top of the bitline contact structure hole is greater than a growth rate of a middle of the bitline contact structure hole can be improved in a deposition process for fabrication of the bitline contact structure. Voids in the polysilicon layer of the contact structure are reduced, such that quality of the contact structure is improved, and the problem of defects in the contact structure is improved.

After the above steps are completed, an annealing process is performed to form the contact structure. In an embodiment of the present disclosure, the annealing process includes ion implantation. A temperature of the annealing process includes 600° C. to 800° C., and time of the annealing process includes 3 h to 6 h. The annealing process includes an ion implantation process configured for performing ion implantation on the first polysilicon layer and/or second polysilicon layer. After the annealing process is completed, the method further includes a rapid thermal annealing process, and a temperature of the rapid thermal annealing process is higher than the temperature of the annealing process.

In this embodiment, the ion implantation adopts Ge. Annealing polysilicon at a high temperature for a long time may activate thermal activation energy of Si, such that diffusing atoms may transition in crystal. Because a concentration of Si in the holes is relatively low, high-concentration Si diffuses to low-concentration Si due to downhill diffusion, such that the concentration of Si tends to be uniform, thereby improving the problem of voids and holes. In the process of decreasing from the high temperature to a low temperature, the diffusion process will be frozen, such that a structure and a state of dynamic recovery or dynamic recrystallization may be maintained. In this way, the problem of voids and holes in the first polysilicon layer 211 is eliminated.

Figure 8A:
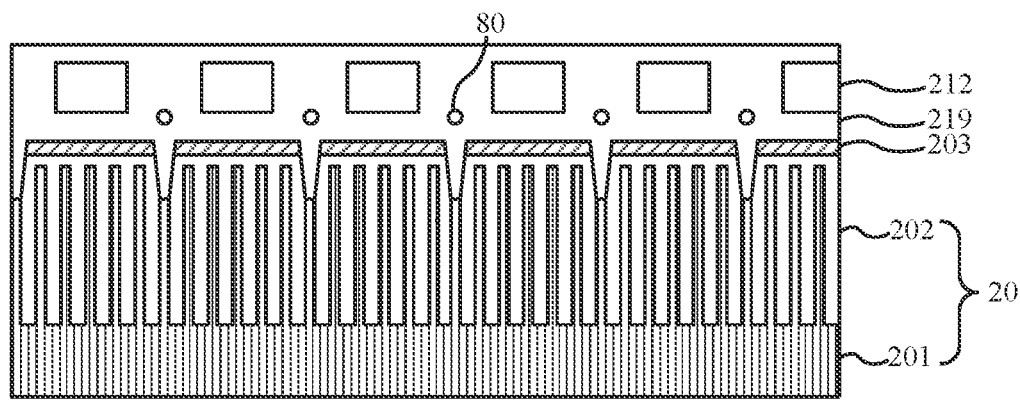
FIGS. 8A-8C are schematic diagrams showing an effect of the annealing process according to an embodiment of the present disclosure.
Figure 8B:
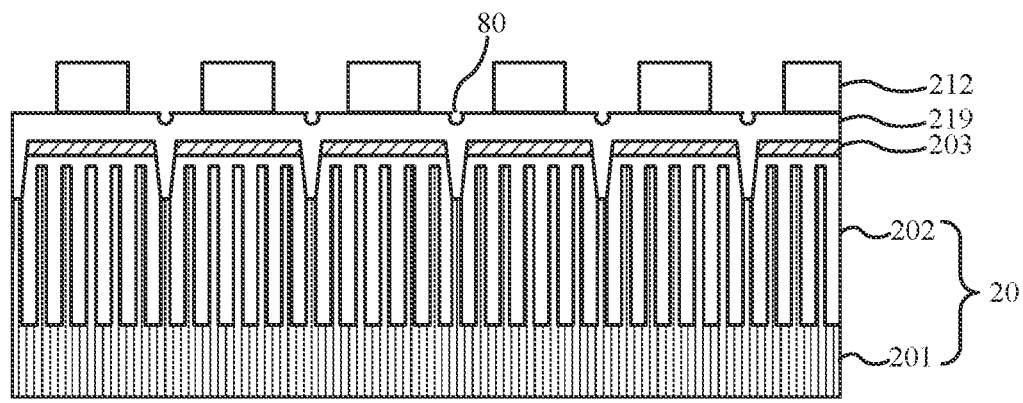
Figure 8C:
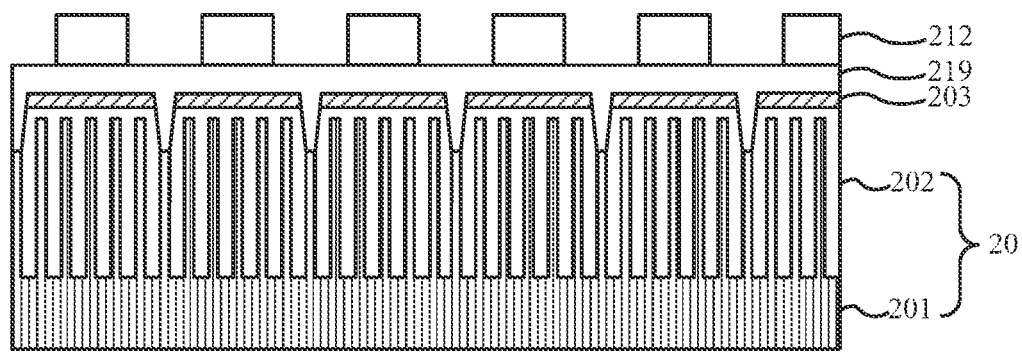

FIGS. 8A-8C are schematic diagrams showing an effect of the annealing process according to an embodiment of the present disclosure. FIG. 8A is a schematic diagram illustrating formation of the voids 80 in the first polysilicon layer 211 in the preceding steps; FIG. 8B is a schematic diagram illustrating the voids 80 exposed after a part of the second polysilicon layer 219 is removed; and FIG. 8C is a schematic diagram showing disappearance of the voids 80 after the annealing process is completed. The stepped structure in the above technical solution has already reduced the voids and the holes generated during the deposition of polysilicon. If there are still a small number of voids and holes generated, the small number of voids and holes can also be eliminated in subsequent annealing process.

After the annealing process is completed, the method further includes a rapid thermal annealing process, and a temperature of the rapid thermal annealing process is higher than the temperature of the annealing process. Time of the rapid thermal annealing process is within 10 seconds, and activity of ion implanted elements is activated by means of a rapid annealing process at a high temperature within a short time. In this embodiment, activity of Ge is activated by means of the rapid annealing process at a high temperature within a short time.

According to the above technical solution, by using the stepped structure in the process of fabricating the contact structure, the problem of formation of voids and holes in a bitline contact structure hole caused by a fact that a growth rate of a top of the bitline contact structure hole is greater than a growth rate of a middle of the bitline contact structure hole can be improved in a deposition process for fabrication of the bitline contact structure. By means of the annealing process, the voids and the holes generated during growth of polysilicon are further reduced, such that the quality of the contact structure is improved, and the problem of defects in the contact structure is improved.

After the above steps are completed, the contact structure described in the present disclosure is obtained, and the contact structure is formed by any one of the above methods. In the above technical solution, by using the stepped structure in the process of fabricating the contact structure, the problem of excessive voids in the polysilicon layer is improved, and the voids and the holes generated during the growth of polysilicon are further reduced by means of the annealing process, such that the quality of the contact structure is improved, and the problem of defects in the contact structure is improved.

The above merely are embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A method for fabricating a contact structure, comprising:
   providing a substrate, and sequentially arranging a first polysilicon layer and a first mask layer on a surface of the substrate;
   forming a stacked layer on the surface of the substrate, the stacked layer comprising an insulating layer, a first polysilicon preparation layer, a first sacrificial layer, the first mask layer, a second sacrificial layer and a second mask layer from bottom to top;
   etching the second sacrificial layer and the second mask layer to form a first groove;
   forming a third sacrificial layer in the first groove to cover the first mask layer, the second sacrificial layer, and the second mask layer;
   removing a part of the third sacrificial layer until the third sacrificial layer is flush with a top of the second mask layer;
   removing the second sacrificial layer and the second mask layer;
   etching the first mask layer, the first sacrificial layer and the first polysilicon preparation layer by using the third sacrificial layer as a mask to form a second groove, a third mask layer, and the first polysilicon layer;
   removing the third sacrificial layer and the first mask layer;
   performing a first etching process on the first polysilicon layer and the third mask layer to form a stepped structure where a width of the third mask layer is smaller than a width of the first polysilicon layer;
   performing a second etching process on the substrate by using the first polysilicon layer as a mask to form a trench;
   depositing a second polysilicon layer in the trench, a top of the second polysilicon layer being not higher than a bottom of the third mask layer; and
   performing an annealing process to form the contact structure.

2. The method according to claim 1, wherein an etching rate of the first polysilicon layer in the first etching process is lower than an etching rate of the third mask layer.

3. The method according to claim 1, wherein the surface of the substrate comprises an insulating layer positioned below the first polysilicon layer.

4. The method according to claim 1, wherein the second etching process comprises: etching the insulating layer and the substrate to form the trench.

5. The method according to claim 1, wherein forming the second polysilicon layer comprises:
   depositing polysilicon on a surface of the stepped structure and a surface of the trench to form a second polysilicon preparation layer;
   depositing polysilicon on a surface of the second polysilicon preparation layer to form a third polysilicon preparation layer filling a gap between the trench and the stepped structure; and
   etching the second polysilicon preparation layer and the third polysilicon preparation layer to form the second polysilicon layer.

6. The method according to claim 1, wherein the substrate comprises a shallow trench isolation structure comprising one or more of silicon oxide, silicon nitride, and silicon oxynitride.

7. The method according to claim 1, wherein the first mask layer and the second mask layer comprise one or more of SiN, SiON, and SiCN.

8. The method according to claim 1, wherein the third sacrificial layer comprises silicon oxide.

9. The method according to claim 1, wherein a temperature of the annealing process comprises 600° C. to 800° C., and time of the annealing process comprises 3 h to 6 h.

10. The method according to claim 1, wherein the annealing process comprises an ion implantation process configured for performing ion implantation on the first polysilicon layer and/or second polysilicon layer.

11. The method according to claim 1, wherein after the annealing process is completed, the method further comprises a rapid thermal annealing process, a temperature of the rapid thermal annealing process being higher than the temperature of the annealing process.

12. The method according to claim 1, wherein the insulating layer comprises one or more of SiN, $SiO_2$, and SiON.

13. The method according to claim 1, wherein the first etching process adopts a wet etching process and an etching gas comprising $H_2$ and/or $N_2$.

14. The method according to claim 1, wherein the top of the second polysilicon layer being lower than the bottom of the third mask layer.

* * * * *